United States Patent [19]

Scherer

[11] Patent Number: 4,477,828
[45] Date of Patent: Oct. 16, 1984

[54] MICROCIRCUIT PACKAGE AND SEALING METHOD

[76] Inventor: Jeremy D. Scherer, Shore Acres Rd., South Dartmouth, Mass. 02748

[21] Appl. No.: 433,792

[22] Filed: Oct. 12, 1982

[51] Int. Cl.³ .................. A01L 39/02; A01L 23/28; A01L 23/30; A01L 23/02
[52] U.S. Cl. .................................. 357/80; 357/72; 357/73; 357/74
[58] Field of Search .................. 357/72, 73, 74, 80

[56] References Cited

U.S. PATENT DOCUMENTS 3,271,634  9/1966  Heaton ................................. 357/73
3,489,845  1/1970  Landron ............................... 357/80
3,622,419 11/1971  London et al. .

FOREIGN PATENT DOCUMENTS 56-40264  4/1981  Japan ................................... 357/72
56-58249  5/1981  Japan ................................... 357/72

Primary Examiner—Martin H. Edlow
Assistant Examiner—John Lamont
Attorney, Agent, or Firm—Banner, Birch, McKie & Beckett

[57] ABSTRACT

A microcircuit package and sealing method in which a non-organic coating is used to hermetically seal the microcircuit. The microcircuit is isolated and insulated in order to protect the microcircuit from the high temperature required to apply and cure a non-organic coating. The materials and methods used to isolate and insulate the microcircuit are chosen so that the thermal coefficients of the materials are complementary and thus form a highly reliable, durable seal, while also insulating the microcircuit during the process of applying the non-organic coating.

10 Claims, 3 Drawing Figures

MICROCIRCUIT PACKAGE AND SEALING METHOD

BACKGROUND OF THE INVENTION

1. Technical Field

This invention relates to a package for a microcircuit, such as an integrated or hybrid circuit, and a method of hermetically sealing the microcircuit package.

2. Background Art

Packaging and sealing techniques for integrated and hybrid circuits are well-known. Generally, an integrated circuit (I.C.) refers to a single chip (die) device which requires only a small cavity or space for packaging the chip. A hybrid circuit generally refers to a multi-component assembly which requires a larger cavity for packaging. In this specification, the term microcircuit will refer both to I.C.s and to hybrid circuits.

Integrated and hybrid circuits must be enclosed or packaged for most commercial applications in order to make handling them easier and to protect the circuit. It is common to assemble these circuits in small packages known as flat packs, because of their essentially flat shape and planar leads. Other commonly used packages are plug-in packages with leads at right angles through the package body and dual in-line packages with two rows of parallel leads at right angles to the package body. The leads of a dual in-line package are outside of the package body instead of through the package body as with plug-in packages. The packages are usually sealed by a lid. The circuits in these packages must be hermetically sealed to isolate the circuit from the atmosphere, dirt, moisture, and other contamination which could destroy the circuit or affect its operation. Obviously it is desirable to be able to produce hermetic packages in high volumes at low cost and be able to seal them hermetically in high volumes at low cost, while still maintaining an effectively protected microcircuit.

The four basic types of seals commonly used for hermetically sealing a microcircuit package are a weld seal, a solder seal, a frit seal, and a plastic seal. A welded seal is generally the most expensive and the slowest to make, however, the hermeticity and yield achieved with a welded seal is the best. Plastic seals are the least expensive, but their hermeticity is poor.

Welded seals may be made by any one of a number of conventional methods. Welded seals may be made also with energy forms such as lasers or electron beams. Seam welding usually is done by delivering welding current through two opposed rollers resting on opposite sides of a lid for a microcircuit packages. Normally this method is used with a stepped lid on a metal package. Packages of ceramic, glass, or other non-metallic materials can be used with the addition of a metal seal ring of sufficient thickness to protect the package from the thermal stress of welding. Seam welding tends to be a very slow process, requires a flat sealing surface, and is relatively expensive.

Resistance welding is an electrical weld where the entire perimeter of the package/lid is sealed simultaneously and the current flows through both the package and lid. A triangular projection on either the package or lid is normally used to develop a point of high electrical resistance to aid getting a uniform weld all the way around the sealing surface. This welding method requires expensive equipment and packages which must be specifically tooled. Very large power sources are needed when using alternating current for resistance welding.

Cold welding requires that the package and lid have a soft malleable material on their mating surfaces. The package and lid are forced together under high pressure so that the two mating surfaces diffuse into each other. This method requires special package designs and expensive raw materials and equipment. The package produced is not very durable.

Soldered seals also may be produced by any one of several well-known methods. The package and lid with solder between them is heated to form a hermetic seal. Generally, the whole assembly is held in alignment with a spring clip or lies in a mold with the weight of the components or some additional weight forcing together the surfaces to be soldered. The solder material used for this type of seal usually includes gold and both of the sealing surfaces are usually gold-plated. Because of the high price of gold, this method is very costly. Flat sealing surfaces are also required.

Perimeter soldering is done by heating the lid while heat sinking the package, or only heating the perimeter of the lid while cooling the center of the package. With this method, gaseous pressure in the package must be controlled carefully so that the solder does not get blown out during heating or sucked into the package while cooling. As with other soldering methods, this method requires a flat sealing surface, usually requires gold on the sealing surface, and is a relatively slow process.

So-called "frit" seals require a low temperature glass instead of solder for sealing microcircuit packages. This method does not require gold plated sealing surfaces. Flat sealing surfaces are not as critical to this method as they are in the weld and solder sealing methods. However, the microcircuit package is subject to higher and thus potentially more damaging heat than with other methods. The hermeticity of the seal is not as effective as in other sealing methods.

"Cerdip" is a particular package whose name has been taken for a sealing method. "Cer" refers to ceramic and "dip" to Dual-In-Line, a package configuration. This method requires a lead frame placed between two pieces of ceramic which have been glazed with frit on the sides facing the lead frame. The package is processed to melt the frit and thus seal the package.

Hot cap sealing is a frit-related sealing method. A perimeter of frit is placed on the package and sometimes the lid. The lid is heated above the melting point of the frit and forced onto the package, thus melting the frit on the package and forming a hermetic seal.

Epoxy sealing is the name generally given to sealing a lid to a package with plastic medium, sometimes in the form of a preform, much the same as solder sealing. Heat is not generally required to melt the preform. Some package styles permit sealing with poured or dispensed epoxy. Although this sealing method is relatively inexpensive and does not require special equipment or especially flat sealing surfaces, the quality of hermeticity of the seal is poor.

Conformal coating a microcircuit to seal it is well-known. The microcircuit is usually immersed or dipped into fluid plastic. The coating will be either self-curing or require a heat cure. In most cases, the conformal coating obviates the need for a package for the microcircuit. As an alternative to dipping the microcircuit into fluid plastic, a fluid bed be may be used to keep epoxy powder suspended in a stream of air or inert gas.

The microcircuit package is dipped into the powder after it is heated so the particles of epoxy melt and thus seal the microcircuit. The microcircuit package also may be sprayed with liquid form plastic or epoxy powder instead of dipping it. This seal method is relatively inexpensive, but it provides a seal of poor hermeticity and has poor dimensional stability.

Plastic molded packaging requires the microcircuit to be bonded in place on a lead frame and the assembly then placed in a mold and encapsulated in plastic. Sometimes a drop of epoxy or similar material is put on the microcircuit to protect it and the wire bonds from the movement of the plastic encapsulant during the molding. Although this process is very inexpensive, the hermeticity of the seal is very poor.

Both the I.C. and the hybrid manufacturer want good, low cost protection for circuits. This is far more difficult to achieve, however, for hybrid circuits. Since the hybrid circuit is generally much larger than the I.C., it is more difficult to package. The larger the dimensions, the more difficult it is to achieve flatness, which is required for the prior art methods which give high hermeticity. The hybrid often contains many different components other than the single chip of the I.C. and thus its processing often has limitations not found with I.C.s. Some hybrids contain components such as electrolytic capacitors or extremely precise resistors and therefor can not withstand a "hot" method of sealing.

Seemingly, the I.C. is far less demanding of its seal process, since it is smaller than a hybrid and there is only one chip to seal. Since I.C.s are produced in such large volumes, however, any slight improvement in their sealing can offer substantial cost savings.

SUMMARY OF THE INVENTION

The present invention provides a low cost, highly effective hermetic seal for microcircuit packages. It can be used with I.C.s or with hybrid circuits. The invention can be used with packages that have rigid dimensions so that the ultimate user can use automated handling equipment with the finished circuits. The invention may be used in conjunction with a first layer coating which encapsulates the microcircuit or, if the circuit is one wherein contact with the the coating might affect the circuit's electrical performance, the invention may be used without such a coating by using a spacer over the microcircuit cavity.

The present invention uses a non-organic coating to achieve a low cost, easily applied, highly effective hermetic seal for a microcircuit. The seal does not require flat sealing surfaces and does not require a separate sealing lid.

In order to hermetically seal a microcircuit package with a non-organic, a way must be devised to protect the circuit from being destroyed by the heat required to keep the coating in a physical state so it can be applied. The present invention isolates the circuit and insulates it from the heat and applies the non-organic coating in a way other than "total immersion", so that the measures to protect the microcircuit from excessive heat will not be overwhelmed.

Any microcircuit package that has a continuous perimeter sealing surface can be hermetically sealed by the present invention. The invention may be used, for example, in a microcircuit mounted in a multi-layer or single-layer ceramic package, an all-metal package or a glass package. The present invention does not require gold as in many prior art sealing methods; it does not require flatness control, which is important to many prior art welding or solder methods; and it does not require an expensive special lid as with seam welding. As a method for providing a good hermetic seal for a conventional microcircuit package, the present invention is less expensive than prior art sealing methods. The invention subjects the microcircuit to a much lower temperature than most prior art methods, making it acceptable for most hybrids.

The invention also may be used in the field of mother boards. The present invention will permit the use of an uncased die on these circuits instead of having them encased in chip carriers. Since a mother board is a form of hybrid, the ability to seal it means conventional hybrid substrates can be sealed also, thus avoiding the need for a package.

DESCRIPTION OF THE PREFERRED EMBODIMENTS

Figure 1:
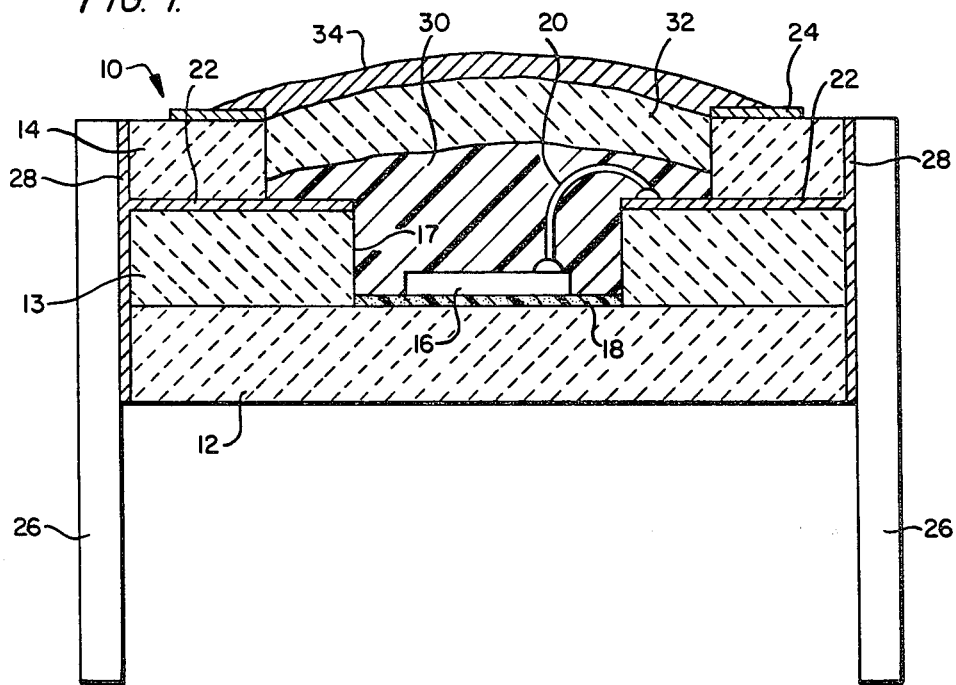
FIG. 1 is a cross-section of a microcircuit package hermetically sealed according to the present invention.

This invention relates to a hermetically sealed microcircuit generally indicated at 10. The microcircuit includes, in one of the preferred embodiments, a multi-layered ceramic package shown at 12, 13 and 14. However, as shown and described in connection with FIG. 3, a single layer ceramic package may also be used. Metal and glass packages also may be sealed by this invention. The microcircuits of this invention are typically approximately 0.600 inches wide and 0.125–0.150 inches high. In the drawings, the proportion has been modified to show the details of the invention.

A microcircuit 16 shown in the drawings as a single semiconductor chip or die, is mounted in a cavity formed in the multi-layer ceramic base. However, the invention may be used also with multicomponent hybrid circuits. The microcircuit 16 is attached to the bottom surface of cavity 17 by a conventional method, as is shown generally at 18. Often the bottom surface of cavity 17 is metallized and the microcircuit is soldered to the metallized surface. Alternatively, the bottom surface of cavity 17 may not be metallized and the microcircuit is attached in the cavity 17 by a bond agent, such as epoxy or glass. A wire bond 20 connects the microcircuit 16 to a metallized bonding pad 22. A continuous perimeter sealing surface 23 is formed on the upper surface of the multi-layer ceramic package, surrounding the cavity 17 in which the microcircuit is fixed. In one embodiment of the invention, this surface is metallized. It may also have a seal ring 24 bonded to the metallized surface. An electrical lead connector 26 is attached to the ceramic base by a conductive connection 28 which contacts the bonding pad to complete the circuit connection between the microcircuit 16, the wire bond 20, the bonding pad 22 and the lead 26. The above described microcircuit package is a conventional package used throughout the I.C. industry. Hybrid circuits are generally similar to this arrangement.

According to one embodiment of the invention, shown in figure 1, a three layer hermetic seal for a microcircuit is provided. The first layer 30 consists of a coating encapsulating the microcircuit in order to isolate, protect from contamination and insulate the microcircuit; the second layer or cover 32 further protects and insulates the microcircuit; and the third layer 34 is a non-organic coating, such as a molten metal or a glass, which is sprayed over the second layer covering the cavity 17 and the sealing surface 23 so that the non-organic coating fuses to the sealing surface in order to hermetically seal the microcircuit package.

The three layers are chosen so that their thermal coefficients are complementary. The third layer non-organic coating must be applied at a high temperture in order to obtain a physical state which allows it to be sprayed onto the package. However, this high temperature can destroy or damage the microcircuit contained in the cavity. By carefully matching the thermal coefficients of the first layer coating 30, and the second layer 32, a non-organic coating can be applied at a high temperature which provides a highly reliable, durable seal. First layer 30 and second layer 32 also serve to insulate the microcircuit so that the high temperature necessary to apply the non-organic coating 34 will not harm the microcircuit. The first layer coating material is chosen so that its thermal coefficient is complementary to the material of the package and to the application and curing temperature of the second layer material, that is, the first layer material can withstand whatever temperature is necessary to apply and cure the second layer material. The second layer material is chosen so that its thermal coefficient is complementary to the application and curing temperature of the third layer sealing material, that is, the second layer material can withstand whatever temperature is needed to apply and cure the third layer non-organic coating.

According to the embodiment of the invention shown in FIG. 1, a coating material 30 is applied to the microcircuit in order to encapsulate the microcircuit and fill the cavity 17. This coating provides electrical isolation for the microcircuit, but more importantly it serves to protect the microcircuit from contamination and the heat of the remaining process used to hermetically seal the circuit. An example of a coating compound which may be used as coating 30 is an epoxy compound produced by Dow Corning and known as Compound No. 1-2577. This compound cures at room temperature. After curing, it will withstand temperatures up to 390° F. This coating may be applied by any of the methods known in the art, such as an epoxy dispensing syringe. The package may also be spun as the coating 30 is applied in order to obtain a more even distribution of the coating.

The second layer 32 is a protective layer and is preferably a ceramic coating containing materials such as alumina or zirconia in a suitable binder, such as sodium silicate. This material may be applied by any conventional method. An example of an acceptable material is a ceramic adhesive made by Aremco. This material will cure at 200°–250° F. Thus, the ceramic material may be cured at a temperature well within the range of the temperature which the coating 30 will withstand. Accordingly, the microcircuit will not be damaged by the curing of the ceramic layer. After curing, the ceramic material used in this example will withstand temperatures of 3,000° F. or more depending on the exact composition used. The non-organic coating 34 is applied as a spray at a temperature much lower than 3,000° F.

In order to facilitate processing, the first two steps—that is, applying the first layer coating which encapsulates the microcircuit, and applying the second layer over the encapsulated microcircuit—may be batch processed due to the different curing times of each of the materials used and different spray times for the layer 34.

In the preferred embodiments, the microcircuit package, with the microcircuit encapsulated in a coating and a ceramic layer applied over the encapsulated microcircuit, is placed on a conveyor belt with enough thermal mass to allow the conveyor belt to serve as a heat sink. Other processing methods will be obvious to those skilled in the art and may be used also. This conveyor transports the microcircuit package in an inert atmosphere, such as nitrogen, helium, or a mixture of nitrogen and helium, under a series of flame or plasma spray heads which deposit successive layers of a non-organic coating over the cavity 17 and sealing surface 23 to hermetically seal the microcircuit in the cavity. The inert atmosphere insures that the sprayed coating will not oxidize and that the microcircuit environment will not be contaminated. The particular material used as the non-organic coating is chosen to complement the thermal coefficients of the ceramic second layer. Aluminum is a very good material to use as a metal spray because it has a low melting point. Other appropriate metal materials include a nickel-iron-cobalt alloy such as Kovar, which has a coefficient of expansion which will complement the other materials mentioned. Of course, other materials with an appropriate coefficient of expansion may be used also. By controlling the rate of deposition of the non-organic material and keeping in mind the specific heat of the material and its mass relative to that of the package and the heat sink, the process can be controlled so that the microcircuit will not experience any significant heat rise.

When a metal spray is used for coating 34, sealing surface 23 is metallized in a manner which is conventional in the art. When a metal spray is used, a seal ring 24 may be used also. Seal ring 24 would be fused to the metallized surface 23.

The material of the metallized sealing surface 23 or seal ring 24 is chosen so that it will fuse with the sprayed metal to form a hermetic seal. The metallized sealing surface 23 and seal ring 24 should be an oxide resistant metal, preferably gold-plated.

Rather than use a metal spray as layer 34 and a metallized sealing surface 23 or seal ring 24, a glass spray may be used as layer 34. When a glass spray is used, there is no need to metallize sealing surface 23 or to have a separate seal ring and seal ring 24 may thus be eliminated. The glass spray is deposited directly on the upper, continuous perimeter sealing surface 23 of the package. Some glass materials which would be appropriate to use for the non-organic sealing layer 34 have a melting point low enough that they can be applied to a microcircuit package without taking all the precautions disclosed herein for insulating the microcircuit to protect it from heat. Several layers of the non-organic coating applied by spray heads form a continuous coating over the microcircuit cavity and seal the package hermetically with excellent moisture resistance.

As an alternative to spraying the molten non-organic material onto the microcircuit package, the material may be deposited by an evaporation process. Alternatively, the non-organic coating may be applied by a wave soldering machine or by electroplating. If electroplating is used, the second layer material 32 must be made electrically conductive. However, the layer 34 is not limited to application by these methods. The non-organic coating 34 may be applied in any way in which the rate of deposition of the layer 34 can be controlled and in which the heat of application will not destroy the microcircuit.

Care should be taken when depositing a metal layer to precisely control the outer boundaries of the sprayed material. If a metal coating contacts the conductive elements of the microcircuit package, it could alter the electrical properties of the package. Accordingly, in some applications, it may be preferable to use glass as the non-organic coating. As described above, a glass coating 34 also eliminates the need for a metallized sealing surface.

Figure 2:
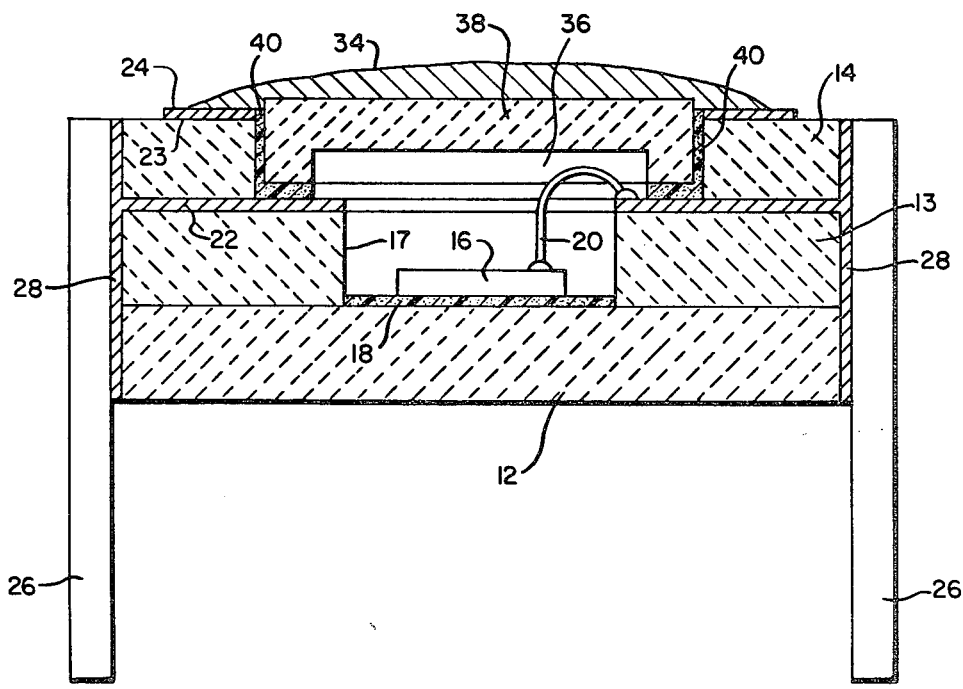
FIG. 2 is a cross-section of a microcircuit package hermetically sealed according to a second embodiment of the invention.

In certain applications it may be desirable not to encapsulate the microcircuit in a first layer coating 30. According to another embodiment of the invention, as shown in FIG. 2, the microcircuit may be isolated from the non-organic coating by providing an atmosphere space 36 over the microcircuit. The space may be defined by a spacer 38 made of a material, such as ceramic, which can withstand the temperatures of applying and curing the non-organic layer 34 and thus serves as a protective layer to the microcircuit. The spacer 38 and the cavity may be made in any way which is conventional in the art. Spacer 38 is attached to the package by means of any suitable bonding agent 40. In a preferred form, bonding agent 40 would be an epoxy compound of the same type used for coating 30 in the previously disclosed embodiment. Similar to the method used to seal the embodiment of FIG. 1, the microcircuit package would then be placed on a conveyor which acts as a heat sink and sprayed with a non-organic coating such as a molten metal or a molten glass to form the hermetic seal for the microcircuit. If a metal spray is used, a metallized sealing surface would be used also, as disclosed above.

Figure 3:
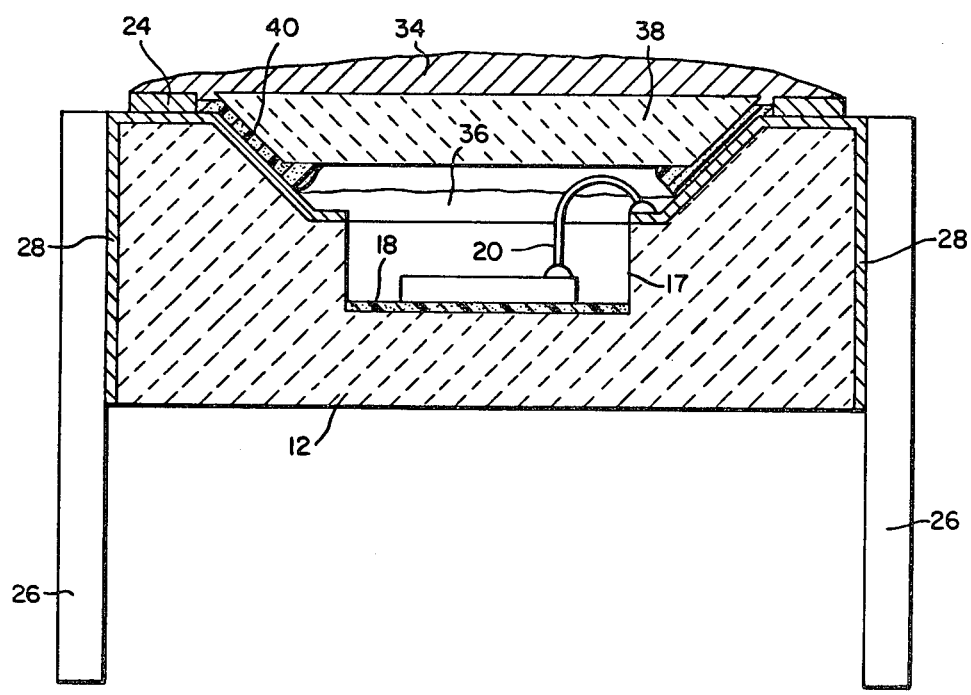
FIG. 3 is a cross-section of a single layer ceramic package hermetically sealed according to a third embodiment of the invention.

According to another embodiment of the invention illustrated in FIG. 3, the invention may be used to seal a microcircuit package which uses a single layer ceramic base. Such bases are less expensive to produce than a multi-layer ceramic package. They also may be more reliable since they do not have layers which can delaminate and permit leaks.

While the invention has been described with reference to particular embodiments, they are not intended to limit the invention, which is defined by the following claims.

What is claimed is:

1. A hermetically sealed microcircuit comprising:
    a microcircuit package having a cavity for receiving a microcircuit, and a continuous perimeter sealing surface surrounding said cavity;
    a microcircuit in said cavity, said microcircuit having a plurality of circuit connections extending from said package;
    a three layer hermetic seal for said microcircuit, said seal comprising
        a first layer of a first material encapsulating said microcircuit, said first layer having an irregular outer boundary;
        a second layer of a second material adhering to and covering said irregular outer boundary of said first layer, said second layer having an irregular outer boundary; and
        a third layer of a third material adhering to and covering said irregular outer boundary of said second layer, said third layer having an irregular outer boundary, and said third layer covering said continuous perimeter sealing surface and fused to said surface.

2. The microcircuit of claim 1 wherein said first layer has a thermal coefficient sufficient to withstand the application and curing temperatures of said second layer, and said second layer has a thermal coefficient to withstand the application and curing temperatures of said third layer.

3. The microcircuit package of claim 2 wherein said first material is an epoxy material, said second material is a ceramic material, and said third material is a non-organic material.

4. The microcircuit package of claim 3 wherein said non-organic third material is a metal, wherein said continuous perimeter sealing surface is a metallized sealing surface, and wherein said third metal material is fused to said metallized sealing surface.

5. The microcircuit package of claim 3 wherein said non-organic third material is a glass material.

6. In a hermetically sealed microcircuit package comprising a microcircuit package having a cavity for mounting a microcircuit;
    a microcircuit mounted in said cavity;
    a wire bond connecting said microcircuit to a bonding pad on said package;
    an electrical lead connector connected to said bonding pad to complete a circuit connection between said microcircuit, said wire bond, said bonding pad and said lead;
    a continuous perimeter sealing surface on the upper surface of said package surrounding said cavity; and
    a hermetic seal for said microcircuit, the improvement wherein said seal has three separate and distinct layers, each of said layers composed of a different material, said seal comprising
        a first layer of a first material encapsulating said microcircuit, said first layer having an irregular boundary;
        a second layer of a second material adhering to and covering said irregular boundary of said first layer, said second layer having an irregular boundary;
        a third layer of a third material adhering to and covering said irregular boundary of said second layer, said third layer having an irregular boundary, and said third layer fused to said continuous perimeter sealing surface.

7. The microcircuit package of claim 6 wherein said first layer, said second layer, and said third layer have thermal coefficients which are complementary.

8. The microcircuit package of claim 7 wherein said first material is an epoxy material, said second material is a ceramic material and said third material is a non-organic material.

9. The microcircuit package of claim 8 wherein said continuous perimeter sealing surface is an oxide resistant metallized sealing surface and said non-organic third material is a metal material.

10. The microcircuit package of claim 8 wherein said non-organic third material is a glass material.

* * * * *